(12) United States Patent
Chen et al.

(10) Patent No.: US 12,414,408 B2
(45) Date of Patent: Sep. 9, 2025

(54) LIGHT EMITTING DEVICE HAVING THIRD ELECTRODE

(71) Applicant: AUO Corporation, Hsinchu (TW)

(72) Inventors: Yi-Hong Chen, Hsinchu (TW);
Chia-An Lee, Hsinchu (TW);
Kuan-Heng Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 466 days.

(21) Appl. No.: 17/890,285

(22) Filed: Aug. 18, 2022

(65) Prior Publication Data

US 2023/0111295 A1    Apr. 13, 2023

(30) Foreign Application Priority Data

Oct. 12, 2021   (TW) ................................. 110137822

(51) Int. Cl.
*H10H 20/831* (2025.01)
*H10H 20/80* (2025.01)
*H10H 20/84* (2025.01)
*H10H 20/855* (2025.01)

(52) U.S. Cl.
CPC ........ *H10H 20/8314* (2025.01); *H10H 20/84* (2025.01); *H10H 20/855* (2025.01); *H10H 20/882* (2025.01)

(58) Field of Classification Search
CPC ........ H01L 33/385; H01L 33/44; H01L 33/58
USPC ......................................................... 257/98
See application file for complete search history.

(56) References Cited

U.S. PATENT DOCUMENTS

| | | |
|---|---|---|
| 8,766,260 B2 | 7/2014 | Kishida et al. |
| 9,433,050 B2 | 8/2016 | Chang |
| 2012/0261702 A1 | 10/2012 | Su et al. |
| 2013/0001559 A1 | 1/2013 | Kishida et al. |
| 2013/0208442 A1* | 8/2013 | Reiherzer ............ B29C 43/146 216/13 |
| 2016/0104818 A1 | 4/2016 | Chang |
| 2020/0052151 A1 | 2/2020 | Kang et al. |

(Continued)

FOREIGN PATENT DOCUMENTS

| | | |
|---|---|---|
| CN | 102054911 | 5/2011 |
| CN | 102959712 | 3/2013 |

(Continued)

*Primary Examiner* — Norman D Richards
*Assistant Examiner* — Colin Russell McCutcheon
(74) *Attorney, Agent, or Firm* — JCIPRNET

(57) ABSTRACT

A light emitting device includes a semiconductor structure, an insulating layer, a first electrode, a second electrode, and a third electrode. The semiconductor structure includes a first type semiconductor layer, a second type semiconductor layer, and an active layer disposed between the first type semiconductor layer and the second type semiconductor layer. The insulating layer is disposed on the semiconductor structure. The first electrode is electrically connected to the first type semiconductor layer. The second electrode is electrically connected to the second type semiconductor layer. The first electrode, the second electrode, and the third electrode are structurally separated. The third electrode at least has a first portion. The first portion of the third electrode is disposed on a side wall of the semiconductor structure, and the insulating layer is located between the third electrode and the semiconductor structure.

12 Claims, 13 Drawing Sheets

(56) References Cited

U.S. PATENT DOCUMENTS

| | | | | |
|---|---|---|---|---|
| 2020/0395501 A1* | 12/2020 | Yamanishi | .............. | H01L 33/26 |
| 2021/0159373 A1 | 5/2021 | Grundmann | | |
| 2021/0225901 A1* | 7/2021 | Luo | ......................... | H01L 25/16 |
| 2021/0408108 A1* | 12/2021 | Kwag | ..................... | H01L 33/62 |

FOREIGN PATENT DOCUMENTS

| | | |
|---|---|---|
| CN | 106206899 | 12/2016 |
| CN | 110047984 | 7/2019 |
| CN | 111564536 | 8/2020 |
| CN | 111725362 | 9/2020 |
| TW | 202002323 | 1/2020 |
| TW | 202134691 | 9/2021 |

* cited by examiner

LIGHT EMITTING DEVICE HAVING THIRD ELECTRODE

CROSS-REFERENCE TO RELATED APPLICATION

This application claims the priority benefit of Taiwan application serial no. 110137822, filed on Oct. 12, 2021. The entirety of the above-mentioned patent applications is hereby incorporated by reference herein and made a part of this specification.

BACKGROUND

Technical Field

The disclosure relates to a light emitting device.

Description of Related Art

A light emitting diode display apparatus includes a driving backplane and multiple light emitting diode chips transposed onto the driving backplane. Inheriting the characteristics of light emitting diodes, light emitting diode display apparatuses have the advantages of power saving, high efficiency, high brightness, and fast response time. Compared with organic light emitting diode display apparatuses, light emitting diode display apparatuses also have the advantages of easy color adjustment, long light emitting lifetime, and no image burn-in. Therefore, the light emitting diode display apparatus is regarded as the next generation display technology. However, a light emitting diode chips is etched from an epitaxial stack; during the etching process, the light emitting diode chip is damaged and produce defects, which leads to a high ratio of side wall current leakage and non-radiative recombination of the light emitting diode chip, which affects the luminous efficiency of the light emitting diode chip.

SUMMARY

The disclosure provides a light emitting device with high luminous efficiency.

The light emitting device of the disclosure includes a semiconductor structure, an insulating layer, a first electrode, a second electrode, and a third electrode. The semiconductor structure includes a first type semiconductor layer, a second type semiconductor layer, and an active layer disposed between the first type semiconductor layer and the second type semiconductor layer. The insulating layer is disposed on the semiconductor structure. The first electrode is electrically connected to the first type semiconductor layer. The second electrode is electrically connected to the second type semiconductor layer. The first electrode, the second electrode, and the third electrode are structurally separated. The third electrode at least has a first portion. The first portion of the third electrode is disposed on a side wall of the semiconductor structure, and the insulating layer is located between the third electrode and the semiconductor structure.

In an embodiment of the disclosure, the side wall of the semiconductor structure includes a side wall of the active layer, and the first portion of the third electrode is disposed on the side wall of the active layer.

In an embodiment of the disclosure, the side wall of the semiconductor structure further includes a side wall of the first type semiconductor layer, and the first portion of the third electrode is further disposed on the side wall of the first type semiconductor layer.

In an embodiment of the disclosure, the side wall of the semiconductor structure further includes a side wall of the second type semiconductor layer, and the first portion of the third electrode is further disposed on the side wall of the second type semiconductor layer.

In an embodiment of the disclosure, the light emitting device further includes a first conductive pattern, a second conductive pattern, and a third conductive pattern. The first conductive pattern is disposed on the first electrode and is electrically connected to the first electrode. The second conductive pattern is disposed on the second electrode and is electrically connected to the second electrode. The third conductive pattern is disposed on the third electrode and is electrically connected to the first portion of the third electrode. The first conductive pattern, the second conductive pattern, and the third conductive pattern are structurally separated.

In an embodiment of the disclosure, the semiconductor structure has a first surface and a second surface opposite to each other. The side wall of the semiconductor structure is disposed between the first surface and the second surface. The third electrode further has a second portion disposed on the first surface of the semiconductor structure and electrically connected to the first portion of the third electrode. The third conductive pattern is disposed on the second portion of the third electrode.

In an embodiment of the disclosure, the light emitting device further includes at least one first optical microstructure overlapping the active layer.

In an embodiment of the disclosure, the active layer emits a light beam, and the at least one first optical microstructure converges the light beam.

In an embodiment of the disclosure, the active layer has a first region and a second region. The second region of the active layer is located between the first region of the active layer and the side wall of the semiconductor structure. The light emitting device further includes at least one second optical microstructure. The at least one first optical microstructure and the at least one second optical microstructure respectively overlap the first region and the second region of the active layer.

In an embodiment of the disclosure, the active layer emits a light beam, the at least one first optical microstructure converges the light beam, and the at least one second optical microstructure diverges the light beam.

In an embodiment of the disclosure, the light emitting device further includes at least one second optical microstructure overlapping the active layer. The active layer emits a light beam, and the at least one second optical microstructure diverges the light beam.

In an embodiment of the disclosure, the third electrode has a reverse bias.

DETAILED DESCRIPTION OF DISCLOSED EMBODIMENTS

Figure 1:
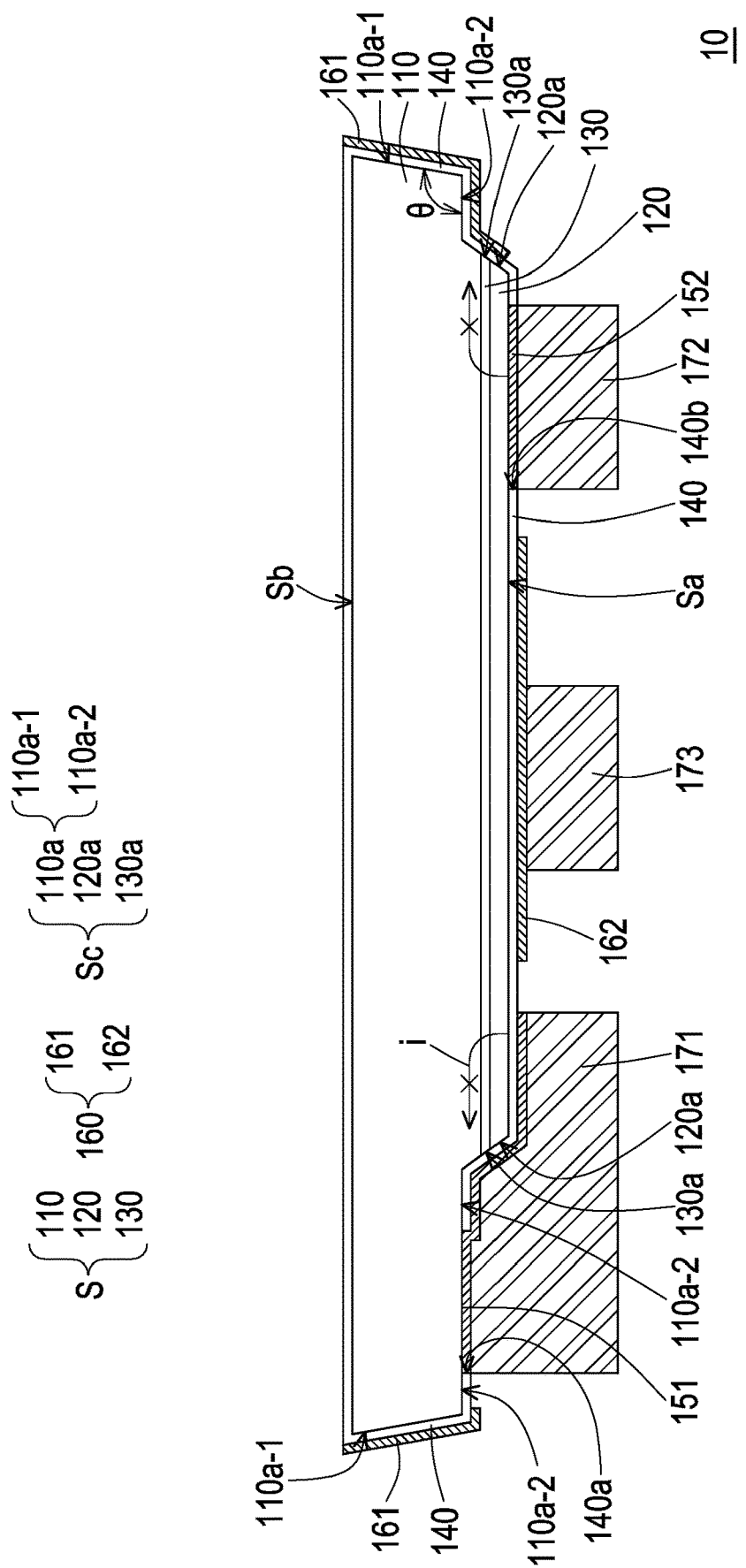
FIG. 1 is a cross-sectional schematic view of a light emitting device 10 according to an embodiment of the disclosure.

References of the exemplary embodiments of the disclosure are to be made in detail. Examples of the exemplary embodiments are illustrated in the drawings. If applicable, the same reference numerals in the drawings and the descriptions indicate the same or similar parts.

It should be understood that when an element such as a layer, a film, an area, or a substrate is indicated to be "on" another element or "connected to" another element, it may be directly on another element or connected to another element, or an element in the middle may exist. In contrast, when an element is indicated to be "directly on another element" or "directly connected to" another element, an element in the middle does not exist. As used herein, "to connect" may indicate to physically and/or electrically connect. Furthermore, "to electrically connect" or "to couple" may also be used when other elements exist between two elements.

The usages of "approximately", "similar to", or "substantially" indicated throughout the specification include the indicated value and an average value having an acceptable deviation range, which is a certain value confirmed by people skilled in the art, and is a certain amount considered the discussed measurement and measurement-related deviation (that is, the limitation of measurement system). For example, "approximately" may indicate to be within one or more standard deviations of the indicated value, or being within ±30%, ±20%, ±10%, ±5%. Furthermore, the usages of "approximately", "similar to", or "substantially" indicated throughout the specification may refer to a more acceptable deviation scope or standard deviation depending on optical properties, etching properties, or other properties, and all properties may not be applied with one standard deviation.

Unless otherwise defined, all terms (including technical and scientific terms) used herein have the same meaning as that commonly understood by one of ordinary skill in the art to which this disclosure belongs. It should be further understood that terms such as those defined in commonly used dictionaries should be construed as having meanings consistent with their meanings in the context of the related art and the disclosure, and are not to be construed as idealized or excessive formal meaning, unless expressly defined as such herein.

Figure 2:
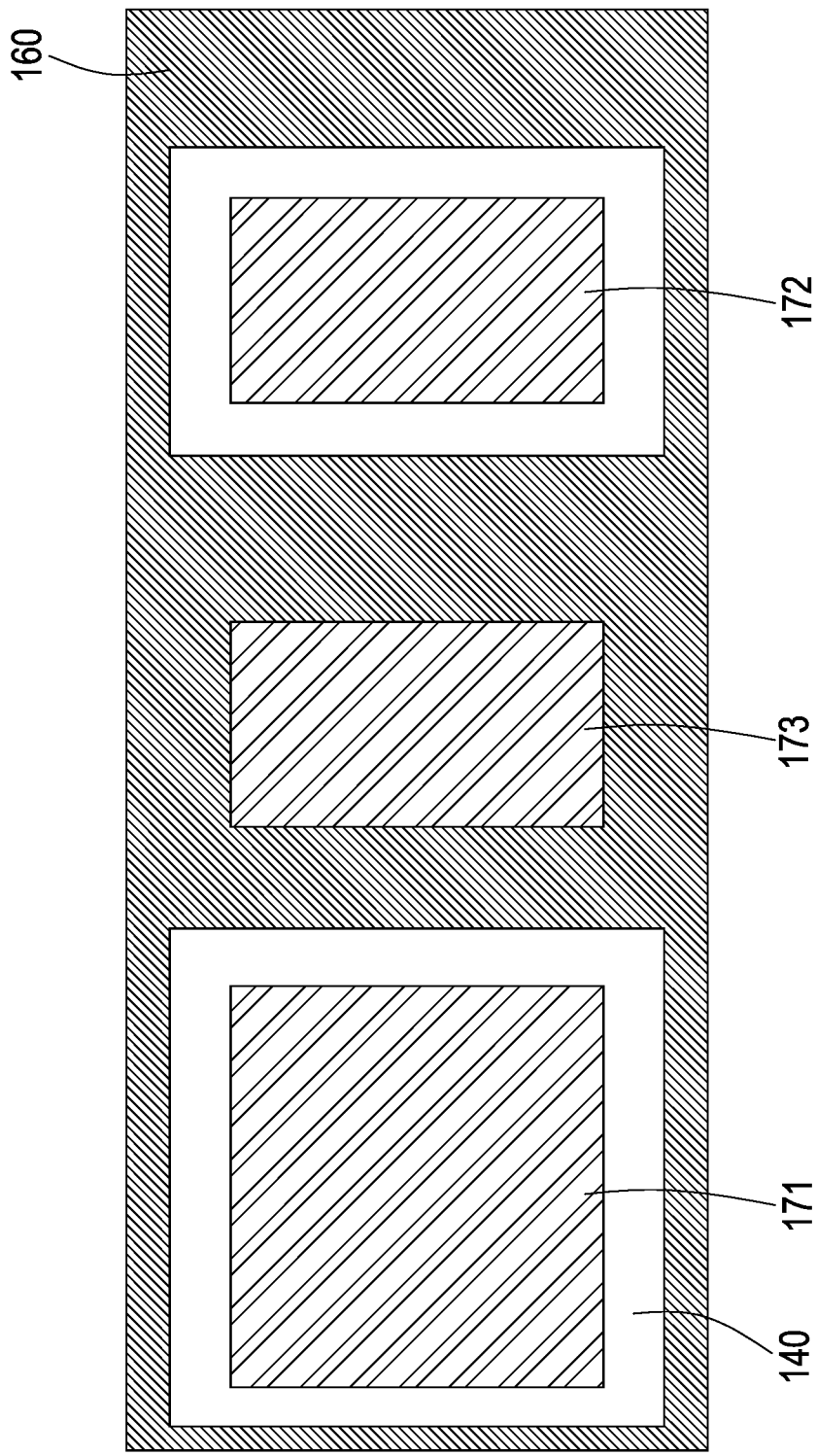
FIG. 2 is a bottom schematic view of the light emitting device 10 of FIG. 1.

FIG. 1 is a cross-sectional schematic view of a light emitting device 10 according to an embodiment of the disclosure. FIG. 2 is a bottom schematic view of the light emitting device 10 of FIG. 1.

Referring to FIG. 1 and FIG. 2, the light emitting device 10 includes a semiconductor structure S. The semiconductor structure S includes a first type semiconductor layer 110, a second type semiconductor layer 120, and an active layer 130. The active layer 130 is disposed between the first type semiconductor layer 110 and the second type semiconductor layer 120. The semiconductor structure S has a first surface Sa, a second surface Sb, and a side wall Sc. The first surface Sa and the second surface Sb are disposed opposite to each other, and the side wall Sc is disposed between the first surface Sa and the second surface Sb.

In this embodiment, an epitaxial stack (not shown) includes a first type semiconductor material layer (not shown), an active material layer (not shown), and a second type semiconductor material layer (not shown) for forming the first type semiconductor layer 110, the active layer 130, and the second type semiconductor layer 120, respectively. The semiconductor structure S is etched from the epitaxial stack, and the side wall Sc of the semiconductor structure S may refer to the etched surface of the semiconductor structure S. In this embodiment, the side wall Sc (i.e., the etched surface) of the semiconductor structure S includes a side wall 110a of the first type semiconductor layer 110, a side wall 130a of the active layer 130, and a side wall 120a of the second type semiconductor layer 120.

For example, in this embodiment, the side wall 110a of the first type semiconductor layer 110 may include a first sub-side wall 110a-1 and a second sub-side wall 110a-2. The first sub-side wall 110a-1 is connected to the second sub-side wall 110a-2, the first sub-side wall 110a-1 and the second sub-side wall 110a-2 form an included angle θ, the side wall 130a of the active layer 130 is connected to the second sub-side wall 110a-2 of the first type semiconductor layer 110, and the side wall 120a of the second type semiconductor layer 120 is connected to the side wall 130a of the active layer 130. In other words, in this embodiment, the side wall Sc of the semiconductor structure S formed by connecting the side wall 110a of the first type semiconductor layer 110, the side wall 130a of the active layer 130, and the side wall 120a of the second type semiconductor layer 120 may not be located on the same plane, in which the side wall Sc of the semiconductor structure S may selectively have a level difference, but the disclosure is not limited thereto.

The light emitting device 10 further includes an insulating layer 140 disposed on the semiconductor structure S. Specifically, in this embodiment, the insulating layer 140 covers at least the side wall Sc and the first surface Sa of the semiconductor structure S, and has a first opening 140a and a second opening 140b respectively overlapping the first type semiconductor layer 110 and the second type semiconductor layer 120. For example, in this embodiment, the material of the insulating layer 140 may be an inorganic material (e.g., silicon oxide, silicon nitride, silicon oxynitride, or a stacked layer of at least two of the foregoing materials), an organic material, or a combination thereof.

The light emitting device 10 further includes a first electrode 151 and a second electrode 152 electrically connected to the first type semiconductor layer 110 and the second type semiconductor layer 120, respectively. Specifically, in this embodiment, the first electrode 151 and the second electrode 152 are respectively filled in the first opening 140a and the second opening 140b of the insulating layer 140 to be electrically connected to the first type semiconductor layer 110 and the second type semiconductor layer 120, respectively. For example, in this embodiment, the first type semiconductor layer 110, the second type semiconductor layer 120, and the active layer 130 may be an n-type semiconductor layer, a p-type semiconductor layer, and a multiple quantum well layer, respectively, and the first electrode 151 and the second electrode 152 may be the cathode and the anode of the light emitting device 10, respectively, but the disclosure is not limited thereto.

The light emitting device 10 further includes a third electrode 160. The third electrode 160 is disposed on the insulating layer 140. The insulating layer 140 is located between the third electrode 160 and the semiconductor structure S. The first electrode 151, the second electrode 152, and the third electrode 160 are structurally separated. The third electrode 160 at least has a first portion 161 disposed on the side wall Sc of the semiconductor structure S.

In this embodiment, the first portion 161 of the third electrode 160 is disposed at least on the side wall Sc of the semiconductor structure S near the first surface Sa. In this embodiment, the first portion 161 of the third electrode 160 is disposed at least on the side wall 130a of the active layer 130. For example, in this embodiment, the first portion 161 of the third electrode 160 may be selectively disposed on the side wall 110a of the first type semiconductor layer 110 and on the side wall 120a of the second type semiconductor layer 120 in addition to being disposed on the side wall 130a of the active layer 130, but the disclosure is not limited thereto. In addition, in this embodiment, the third electrode 160 may optionally have a second portion 162 disposed on the first surface Sa of the semiconductor structure S and electrically connected to the first portion 161 of the third electrode 160, but the disclosure is not limited thereto.

Figure 4:
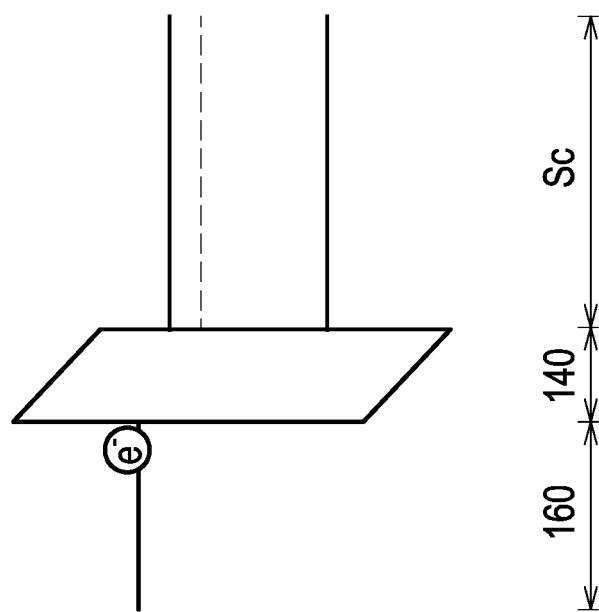
FIG. 4 shows the internal energy band of the light emitting device 10 according to an embodiment of the disclosure when the third electrode 160 has a reverse bias.
Figure 3:
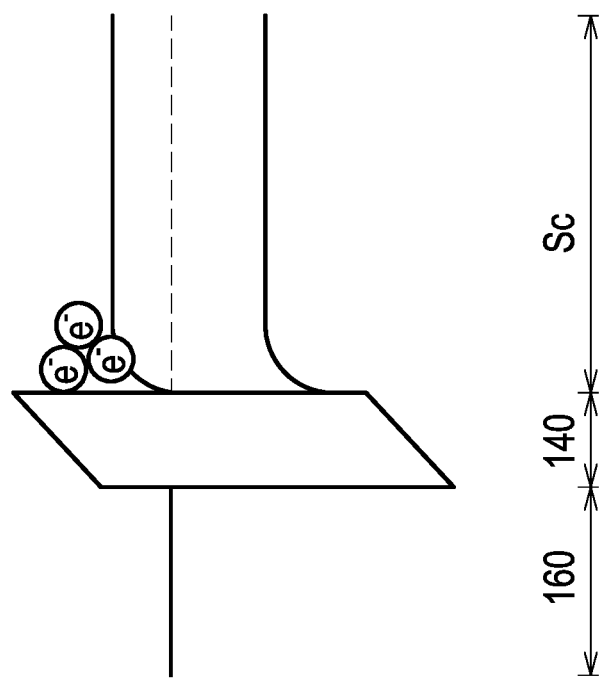
FIG. 3 shows the internal energy band of the light emitting device 10 according to an embodiment of the disclosure when a third electrode 160 is not biased.

FIG. 3 shows the internal energy band of the light emitting device 10 according to an embodiment of the disclosure when a third electrode 160 is not biased. FIG. 4 shows the internal energy band of the light emitting device 10 according to an embodiment of the disclosure when the third electrode 160 has a reverse bias.

Referring to FIG. 1 and FIG. 3, when the third electrode 160 is not biased, the side wall Sc (i.e., the etched surface) of the semiconductor structure S has defects due to the etching process, so that the energy band of the light emitting device 10 is deformed near the interface between the side wall Sc of the semiconductor structure S and the insulating layer 140, and electrons e– are easily trapped near the side wall Sc, thereby non-radiative recombination with electron holes occurs near the side wall Sc, resulting in a leakage current i and a loss in luminous efficiency in the light emitting device 10.

Referring to FIG. 1 and FIG. 4, it is worth mentioning that when the third electrode 160 has a reverse bias, the deformation of the energy band of the light emitting device 10 near the interface between the side wall Sc and the insulating layer 140 may be leveled, so that the electrons e– are not easily trapped near the side wall Sc, thereby radiatively recombining with the electron holes inside the active layer 130. Thereby, the luminous efficiency of the light emitting device 10 may be improved.

Referring to FIG. 1 and FIG. 2, in this embodiment, the light emitting device 10 further includes a first conductive pattern 171, a second conductive pattern 172, and a third conductive pattern 173. The first conductive pattern 171 is disposed on the first electrode 151 and is electrically connected to the first electrode 151. The second conductive pattern 172 is disposed on the second electrode 152 and is electrically connected to the second electrode 152. The third conductive pattern 173 is disposed on the third electrode 160 and is electrically connected to the first portion 161 of the third electrode 160. The first conductive pattern 171, the second conductive pattern 172, and the third conductive pattern 173 are structurally separated.

When the light emitting device 10 is transposed onto the driving backplane (not shown), the first conductive pattern 171, the second conductive pattern 172, and the third conductive pattern 173 connect the first electrode 151, the second electrode 152, and the third electrode 160 of the light emitting device 10 and the driving backplane, thereby forming a display apparatus.

For example, in this embodiment, the third electrode 160 may selectively include the second portion 162 located on the first surface Sa of the semiconductor structure S, and the third conductive pattern 173 may be selectively disposed on the second portion 162 of the third electrode 160 to be electrically connected with the first portion 161 of the third electrode 160. However, the disclosure is not limited thereto, and in other embodiments, the third conductive pattern 173 may also be disposed at other positions.

Referring to FIG. 1, in this embodiment, the first electrode 151 and the second electrode 152 of the light emitting device 10 are disposed on the same side of the active layer 130; after the light emitting device 10 is transposed and electrically connected to the driving backplane (not shown), the first conductive pattern 171 and the second conductive pattern 172 electrically connect the light emitting device 10 and the driving backplane are disposed between the first electrode 151 and the second electrode 152 of the light emitting device 10 and the driving backplane, and the light emitting device 10 may be a flip chip light emitting diode (flip chip LED). However, the disclosure is not limited thereto, and in other embodiments, the light emitting device 10 may also be other forms of light emitting diode devices, which are illustrated in the following paragraphs with other drawings.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 5:
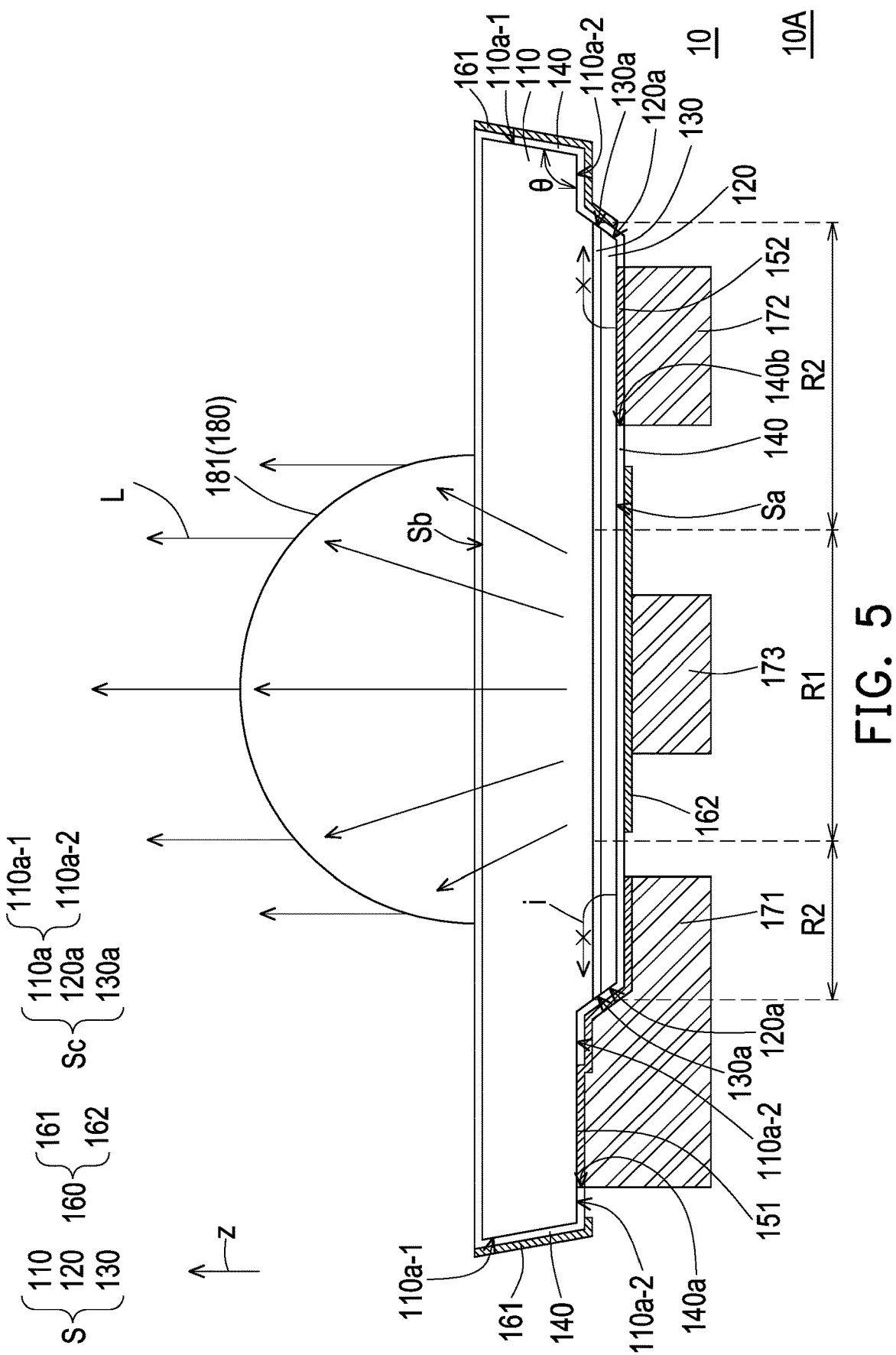
FIG. 5 is a cross-sectional schematic view of a light emitting device 10A according to an embodiment of the disclosure.

FIG. 5 is a cross-sectional schematic view of a light emitting device 10A according to an embodiment of the disclosure.

The light emitting device 10A of FIG. 5 is similar to the light emitting device 10 of FIG. 1, with the difference between the two is that the light emitting device 10A of FIG.

5 further includes an optical microstructure 180 disposed on the transmission path of a light beam L emitted by the active layer 130.

It is worth mentioning that the light emission range of the active layer 130 may be controlled by adjusting the reverse bias voltage of the third electrode 160. Using the third electrode 160 to control the light emission range of the active layer 130 and the secondary optical effect of the optical microstructure 180, the light emitting device 10A may have a special light field. The following is an example for illustration with FIG. 5.

Referring to FIG. 5, in this embodiment, the active layer 130 has a first region R1 and a second region R2, and the second region R2 of the active layer 130 is located between the first region R1 of the active layer 130 and the side wall Sc of the semiconductor structure S. The first region R1 is the middle region of the active layer 130. The second region R2 is the peripheral region of the active layer 130, and the optical microstructure 180 of the light emitting device 10A includes a first optical microstructure 181 overlapping the active layer 130. For example, in this embodiment, the third electrode 160 is applied with a reverse bias voltage, and the electric field caused by the third electrode 160 may concentrate the light emission range of the active layer 130 in the first region R1 (i.e., the middle region), thus the luminous efficiency of the light emitting device 10A is high. The first region R1 of the active layer 130 emits a light beam L, and the first optical microstructure 181 may converge the light beam L, thereby the light emitting device 10A may provide a special light field concentrated in the front view direction. In this embodiment, the first optical microstructure 181 may be a convex lens that protrudes toward a direction z away from the active layer 130, but the disclosure is not limited thereto.

Figure 6:
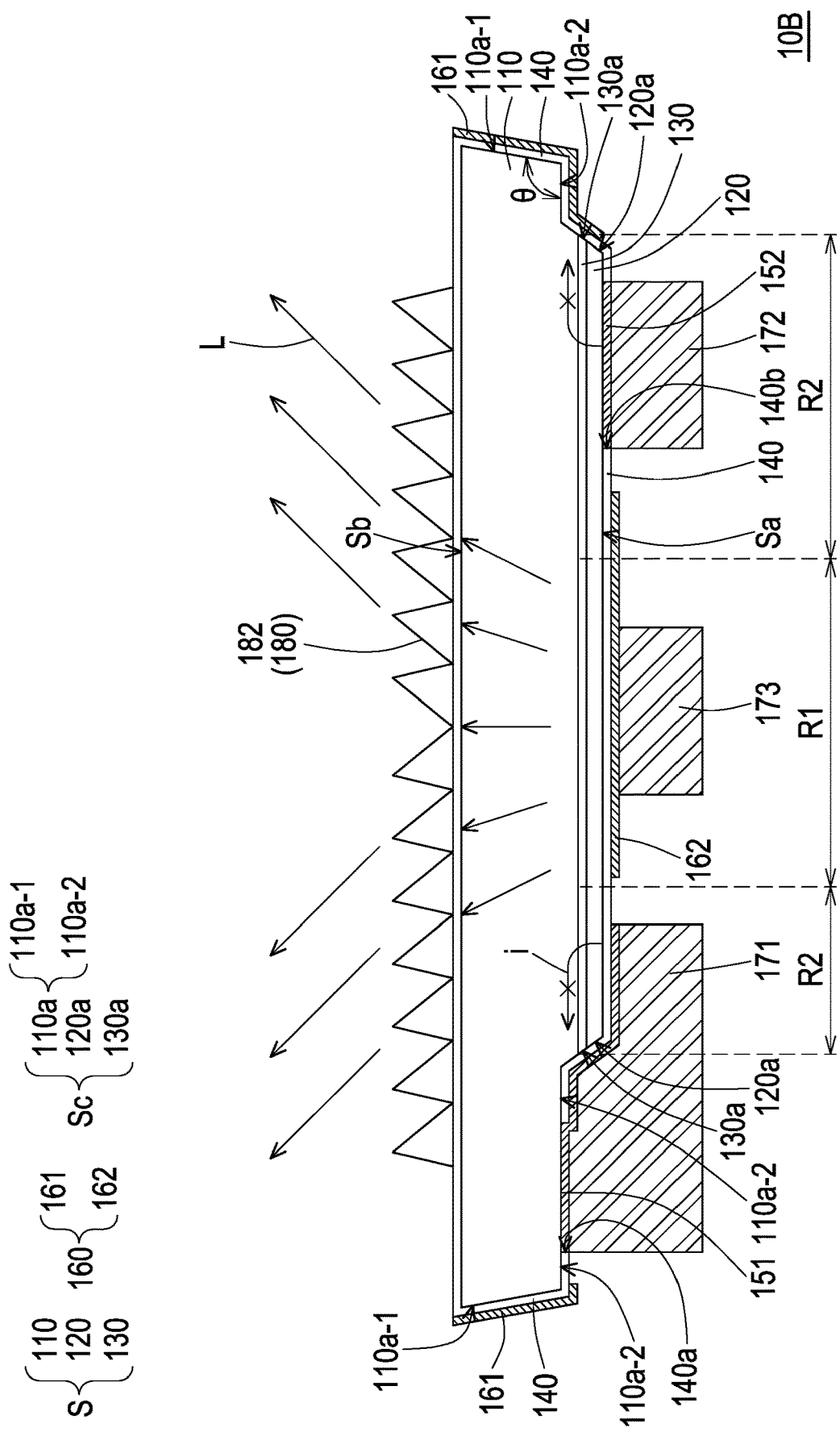
FIG. 6 is a cross-sectional schematic view of a light emitting device 10B according to an embodiment of the disclosure.

FIG. 6 is a cross-sectional schematic view of a light emitting device 10B according to an embodiment of the disclosure. The light emitting device 10B of FIG. 6 is similar to the light emitting device 10A of FIG. 5, and the difference between the two is that the optical microstructure 180 of FIG. 6 is different from the optical microstructure 180 of FIG. 5.

Referring to FIG. 6, specifically, in this embodiment, the optical microstructure 180 of the light emitting device 10B includes a second optical microstructure 182, which overlaps the active layer 130. For example, in this embodiment, the third electrode 160 is applied with a reverse bias voltage, and the electric field caused by the third electrode 160 may concentrate the light emission range of the active layer 130 in the first region R1 (i.e., the middle region), thus the luminous efficiency of the light emitting device 10B is high. The first region R1 of the active layer 130 emits a light beam L, and the second optical microstructure 182 overlapping the active layer 130 may diverge the light beam L, thereby the light emitting device 10A may provide a special light field concentrated in the side view direction. In this embodiment, the second optical microstructure 182 may be a prism structure, but the disclosure is not limited thereto.

Figure 7:
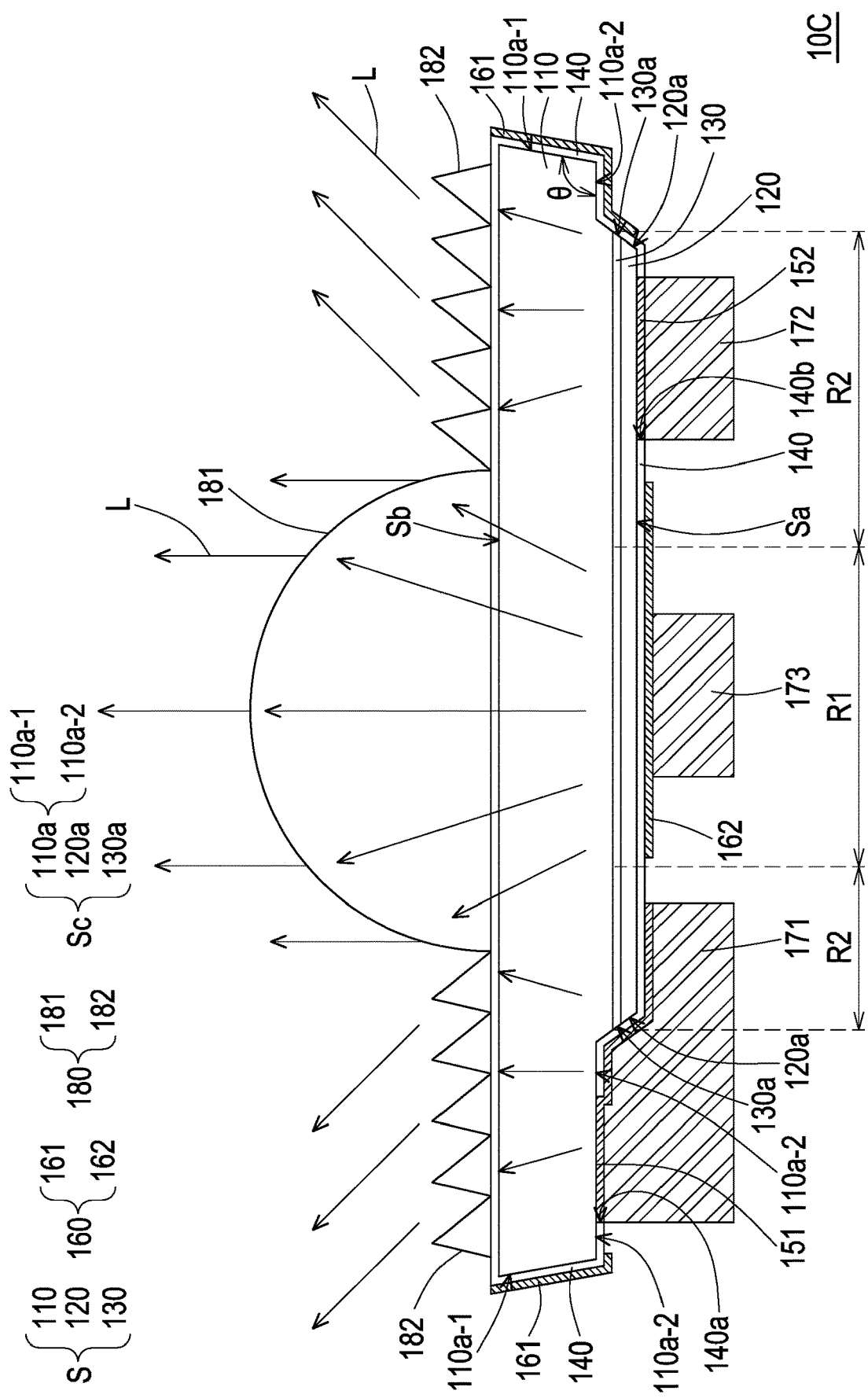
FIG. 7 is a cross-sectional schematic view of a light emitting device 10C according to an embodiment of the disclosure.

FIG. 7 is a cross-sectional schematic view of a light emitting device 10C according to an embodiment of the disclosure. In particular, FIG. 7 shows a situation in which the light beam L is transmitted without biasing the third electrode 160.

Figure 8:
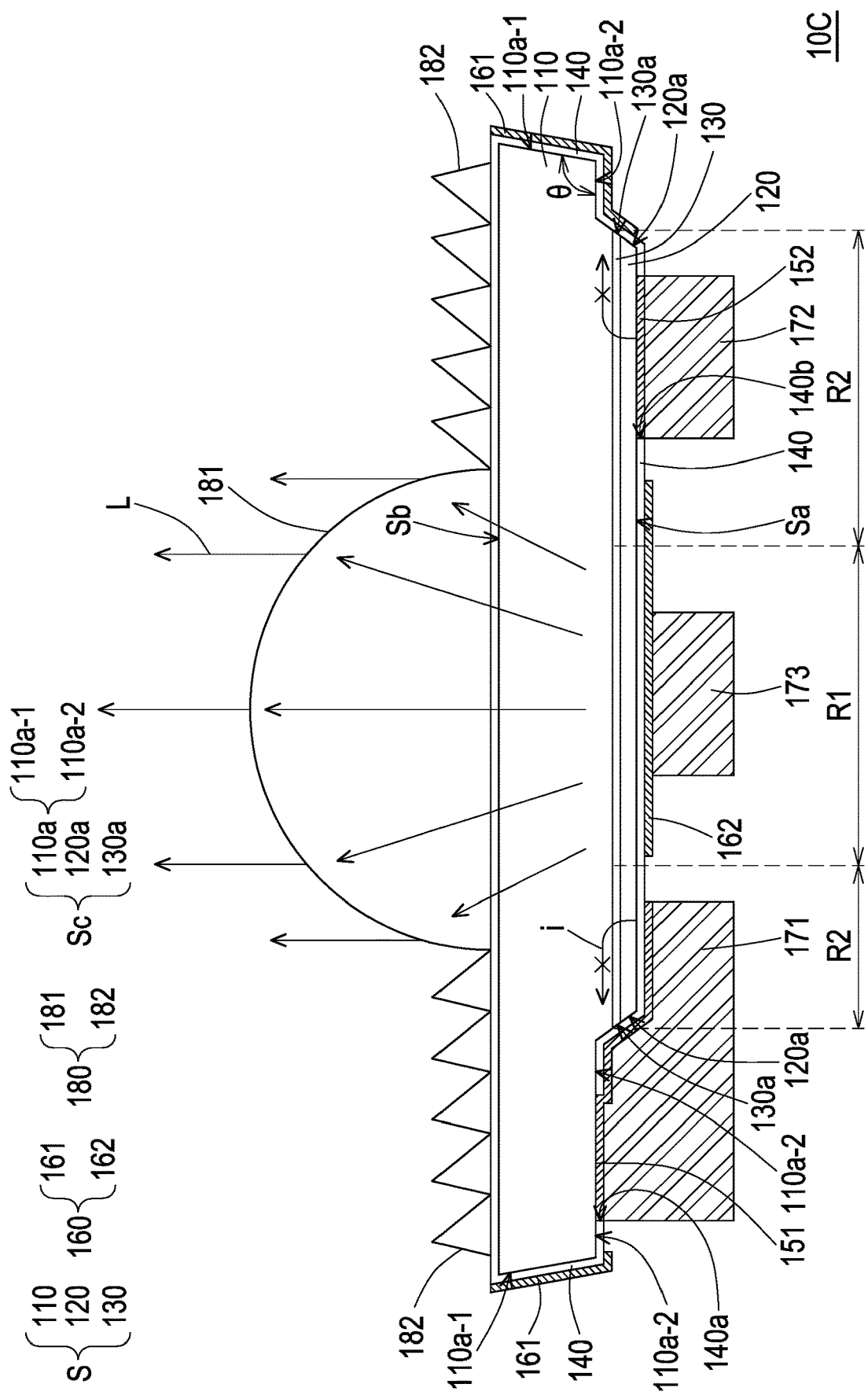
FIG. 8 is a cross-sectional schematic view of a light emitting device 10C according to an embodiment of the disclosure.

FIG. 8 is a cross-sectional schematic view of a light emitting device 10C according to an embodiment of the disclosure. In particular, FIG. 8 shows a situation in which the light beam L is transmitted when the third electrode 160 has a reverse bias.

The light emitting device 10C of FIG. 7 and FIG. 8 is similar to the light emitting device 10A of FIG. 5, and the difference between the two is that the optical microstructure 180 of FIG. 7 and FIG. 8 is different from the optical microstructure 180 of FIG. 5. Referring to FIG. 7 and FIG. 8, specifically, in this embodiment, the optical microstructure 180 includes a first optical microstructure 181 and a second optical microstructure 182, and the first optical microstructure 181 and the second optical microstructure 182 overlap the first region R1 and the second region R2 of the active layer 130, respectively. The first optical microstructure 181 converges the light beam L, and the second optical microstructure 182 diverges the light beam L.

In the embodiment of FIG. 7, the third electrode 160 of the light emitting device 10C may not be biased, and the first region R1 (i.e., the middle region) and the second region R2 (i.e., the peripheral region) of the active layer 130 may both emit a light beam L. The light beam L from the first region R1 may pass through the first optical microstructure 181 in the front view direction, and the light beam L from the second region R2 may pass through the second optical microstructure 182 in the side view direction. Thereby, the light emitting device 10C may provide a uniform light field in all directions.

In the embodiment shown in FIG. 8, the third electrode 160 of the light emitting device 10C may have a reverse bias, and the electric field caused by the third electrode 160 may concentrate the light emission range of the active layer 130 in the first region R1 (i.e., the middle region). The light beam L emitted from the first region R1 of the active layer 130 may pass through the first optical microstructure 181 and be transmitted in the front view direction. Thereby, the light emitting device 10C may provide a light field concentrated in the front view direction.

Referring to FIG. 7 and FIG. 8, by adjusting the bias voltage of the third electrode 160, the first optical microstructure 181, and the second optical microstructure 182, the light field of the same light emitting device 10C may be changed, thereby the display apparatus (not shown) including the light emitting device 10C may be switched between different modes and applied in a specific field.

For example, in this embodiment, when the bias voltage of the third electrode 160 of the light emitting device 10C is substantially 0, the light emitting device 10C provides a uniform light field in all directions, thereby the display apparatus including the light emitting device 10C may operate in a sharing mode; when the third electrode 160 of the light emitting device 10C has a reverse bias, the light emitting device 10C provides a light field concentrated in the front view direction, thereby the display apparatus including the light emitting device 10C may operate in a privacy mode. However, the disclosure is not limited thereto, and in other embodiments, the display apparatus including the light emitting device 10C may also be applied in other fields, such as but not limited to: a three-dimensional display field.

Figure 9:
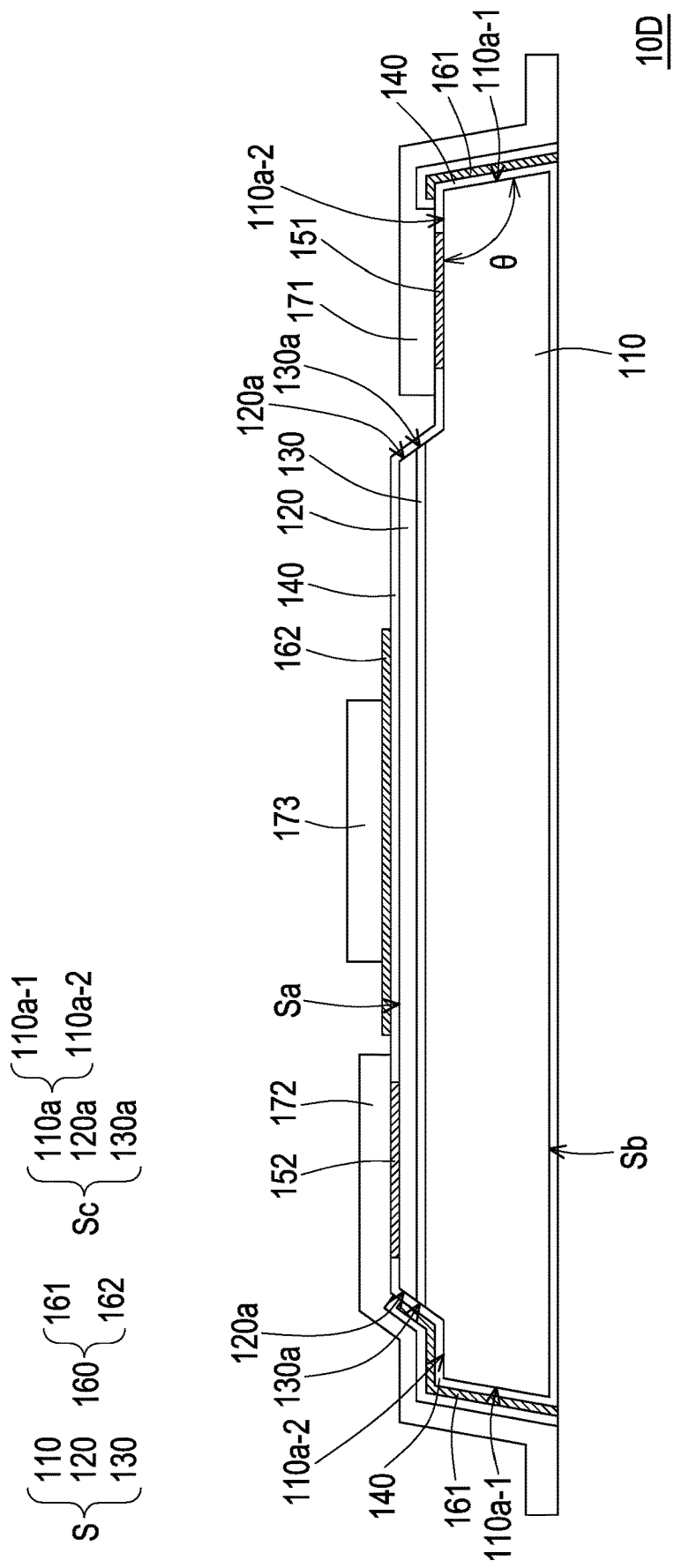
FIG. 9 is a cross-sectional schematic view of a light emitting device 10D according to an embodiment of the disclosure.

FIG. 9 is a cross-sectional schematic view of a light emitting device 10D according to an embodiment of the disclosure.

The light emitting device 10D of FIG. 9 is similar to the light emitting device 10 of FIG. 1, the difference between the two is that the positions of the first conductive pattern 171, the second conductive pattern 172, and the third conductive pattern 173 of the light emitting device 10D of FIG. 9 are different from the positions of the first conductive pattern 171, the second conductive pattern 172, and the third conductive pattern 173 of the light emitting device 10 of FIG. 1.

Referring to FIG. 9, specifically, in this embodiment, after the light emitting device 10D is transposed and electrically connected to the driving backplane (not shown), the semiconductor structure S of the light emitting device 10D is disposed between the first conductive pattern 171 and the driving backplane, between the second conductive pattern 172 and the driving backplane, and between the third conductive pattern 173 and the driving backplane. In other words, in this embodiment, the light emitting device 10D may be a lateral light emitting diode (lateral LED).

Figure 10:
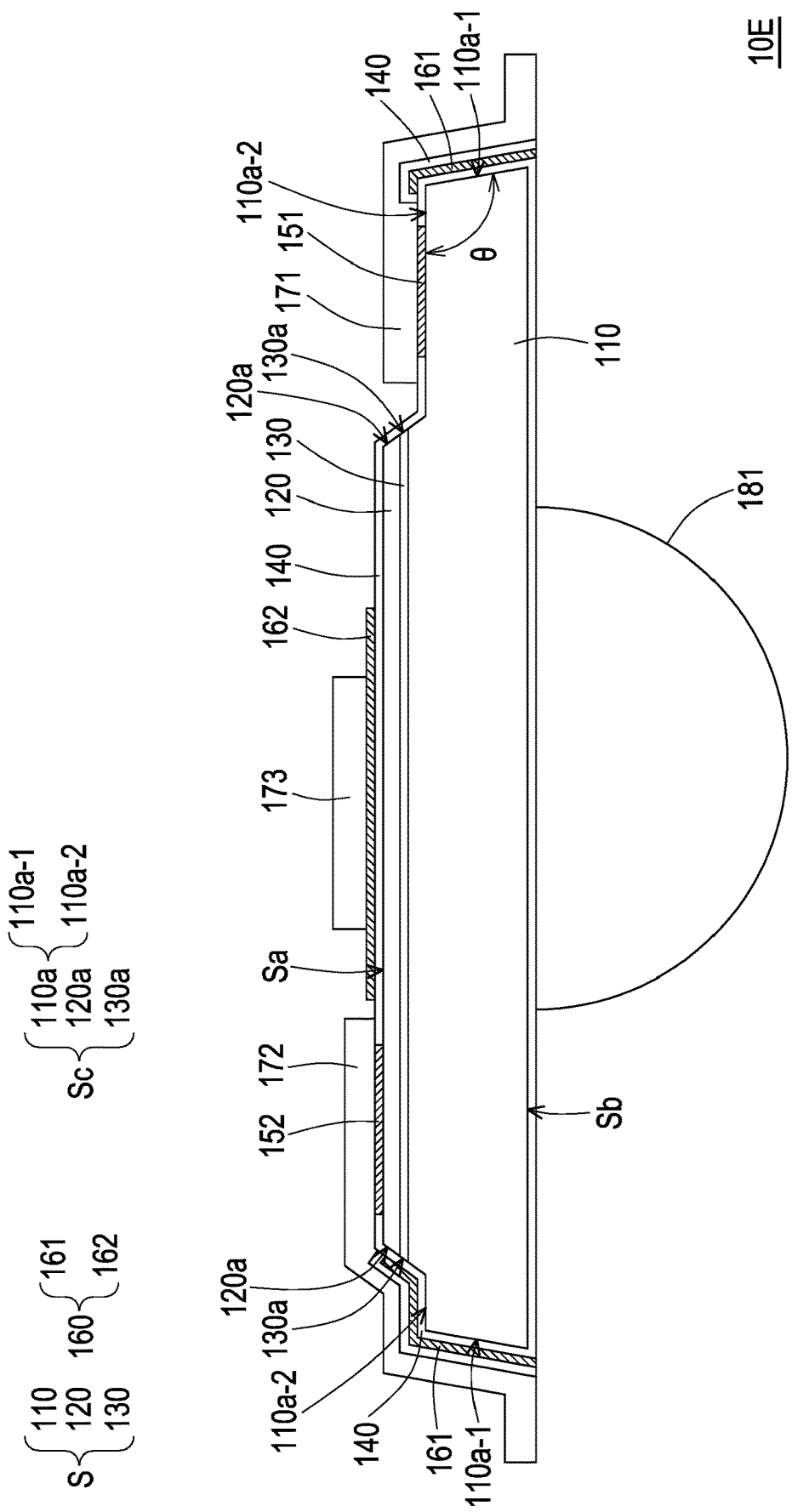
FIG. 10 is a cross-sectional schematic view of a light emitting device 10E according to an embodiment of the disclosure.

FIG. 10 is a cross-sectional schematic view of a light emitting device 10E according to an embodiment of the disclosure. The light emitting device 10E of FIG. 10 is similar to the light emitting device 10D of FIG. 9, the difference between the two is that the light emitting device 10E of FIG. 10 further includes a first optical microstructure 181 overlapping the active layer 130.

Figure 11:
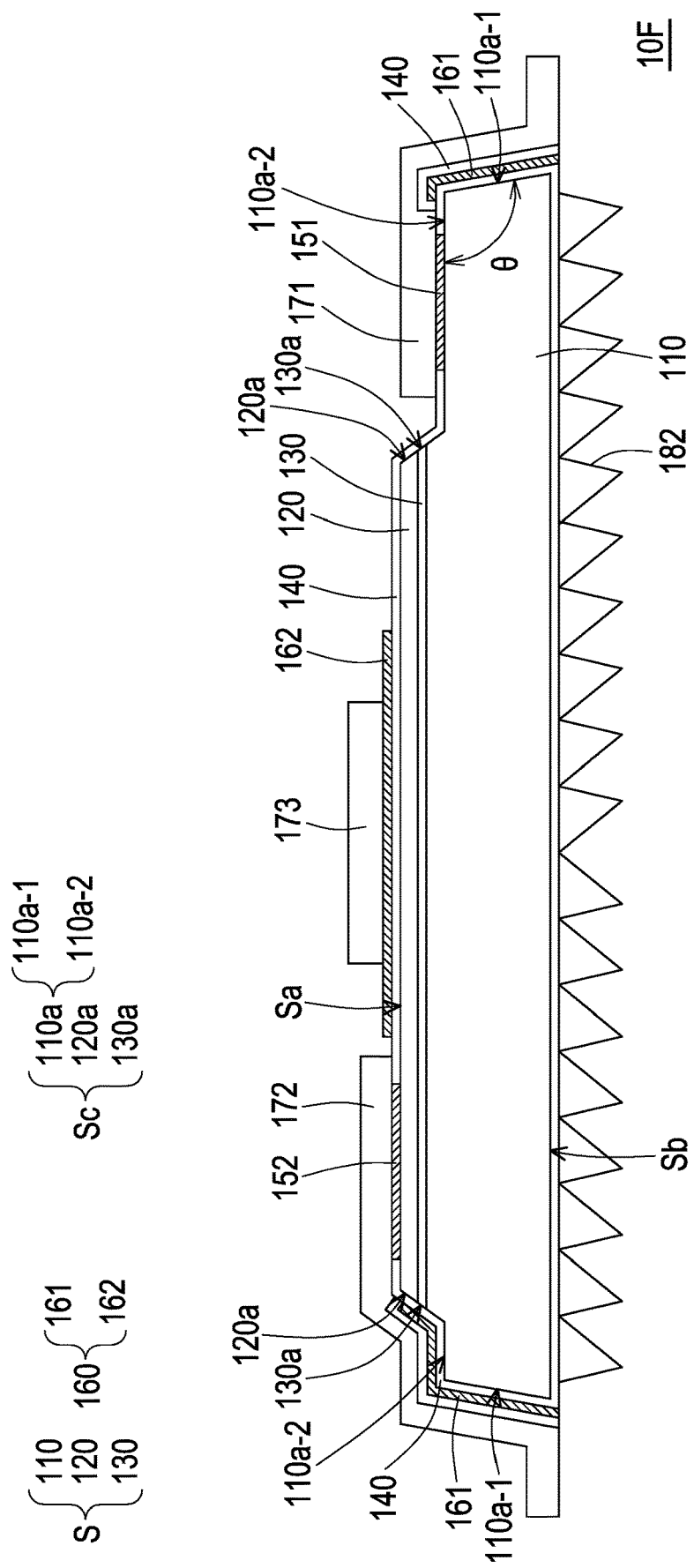
FIG. 11 is a cross-sectional schematic view of a light emitting device 10F according to an embodiment of the disclosure.

FIG. 11 is a cross-sectional schematic view of a light emitting device 10F according to an embodiment of the disclosure. The light emitting device 10F of FIG. 11 is similar to the light emitting device 10D of FIG. 9, the difference between the two is that the light emitting device 10F of FIG. 11 further includes a second optical microstructure 182 overlapping the active layer 130.

Figure 12:
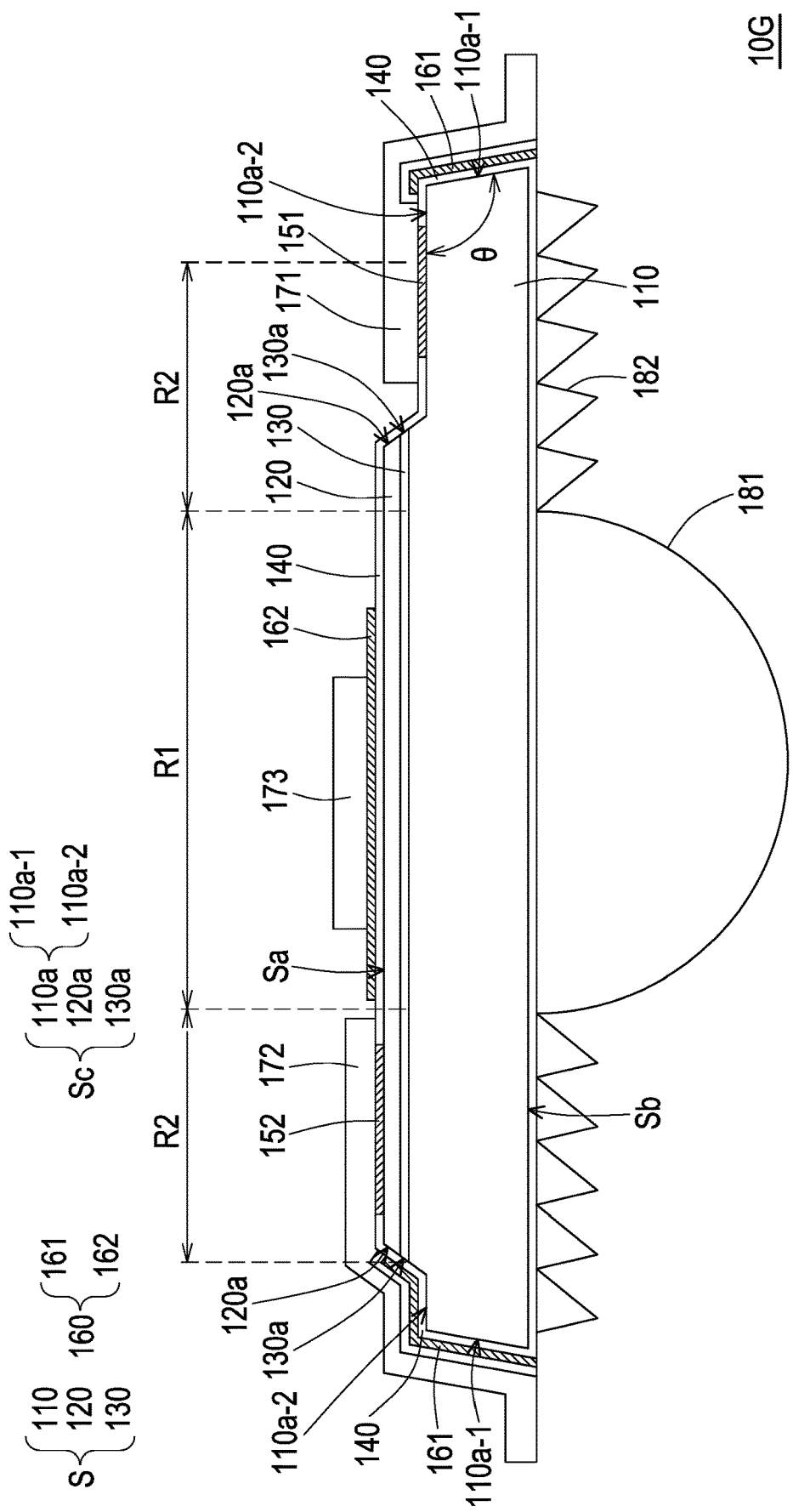
FIG. 12 is a cross-sectional schematic view of a light emitting device 10G according to an embodiment of the disclosure.

FIG. 12 is a cross-sectional schematic view of a light emitting device 10G according to an embodiment of the disclosure. The light emitting device 10G of FIG. 12 is similar to the light emitting device 10D of FIG. 9, the difference between the two is that the light emitting device 10G of FIG. 12 further includes a first optical microstructure 181 and a second optical microstructure 182, which overlap the first region R1 and the second region R2 of the active layer 130, respectively.

Figure 13:
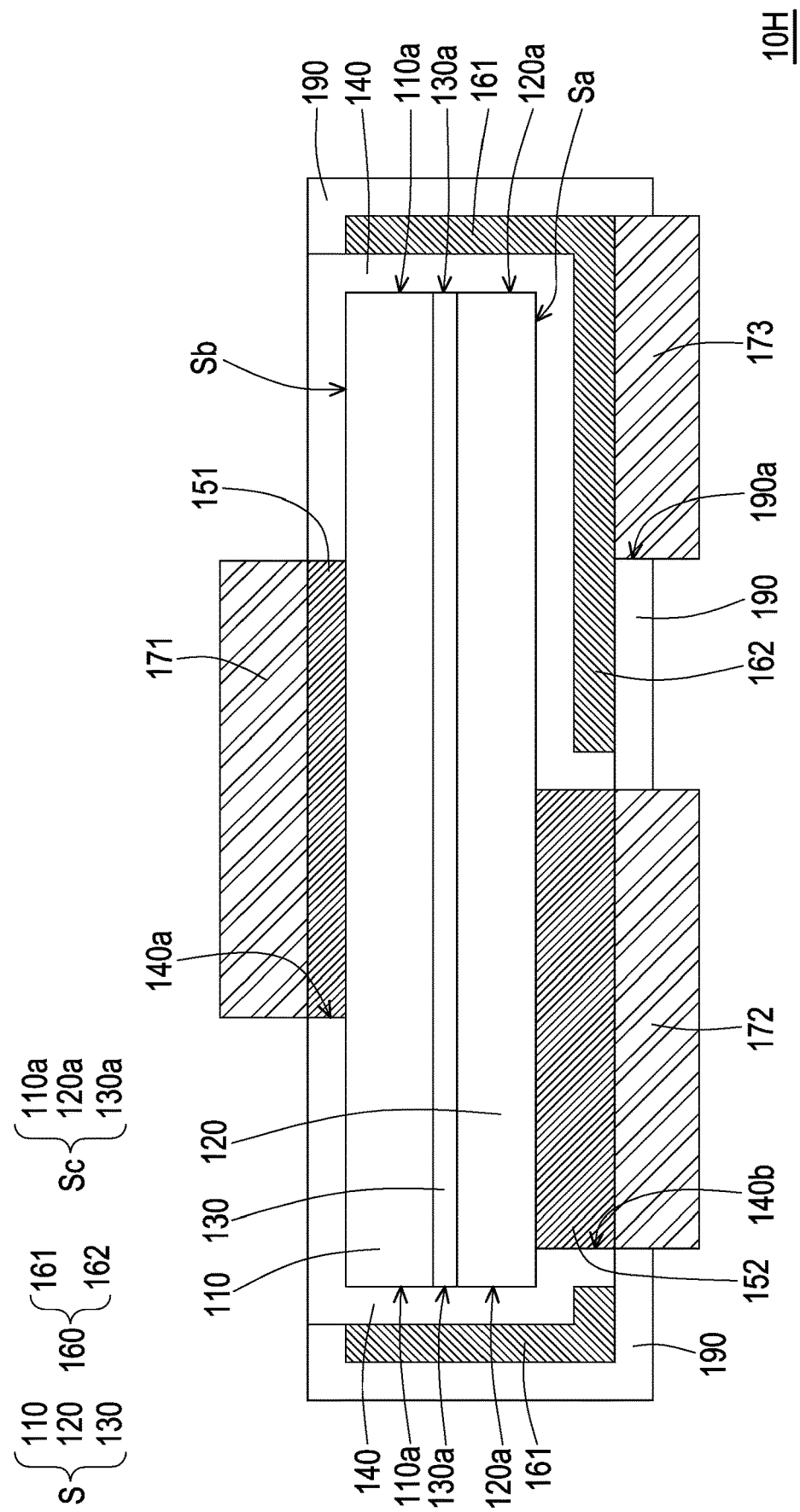
FIG. 13 is a cross-sectional schematic view of a light emitting device 10H according to an embodiment of the disclosure.

FIG. 13 is a cross-sectional schematic view of a light emitting device 10H according to an embodiment of the disclosure. The light emitting device 10H of FIG. 13 is similar to the light emitting device 10 of FIG. 1, the difference between the two is that: in the embodiment of FIG. 13, the first electrode 151 and the second electrode 152 of the light emitting device 10H are respectively disposed on different sides of the active layer 130, and the light emitting device 10H is a vertical light emitting diode (vertical LED). In addition, the light emitting device 10H further includes an insulating layer 190, the insulating layer 190 is disposed on the third electrode 160, and the third conductive pattern 173 may fill an opening 190a of the insulating layer 190 to be electrically connected to the third electrode 160.

Figure 14:
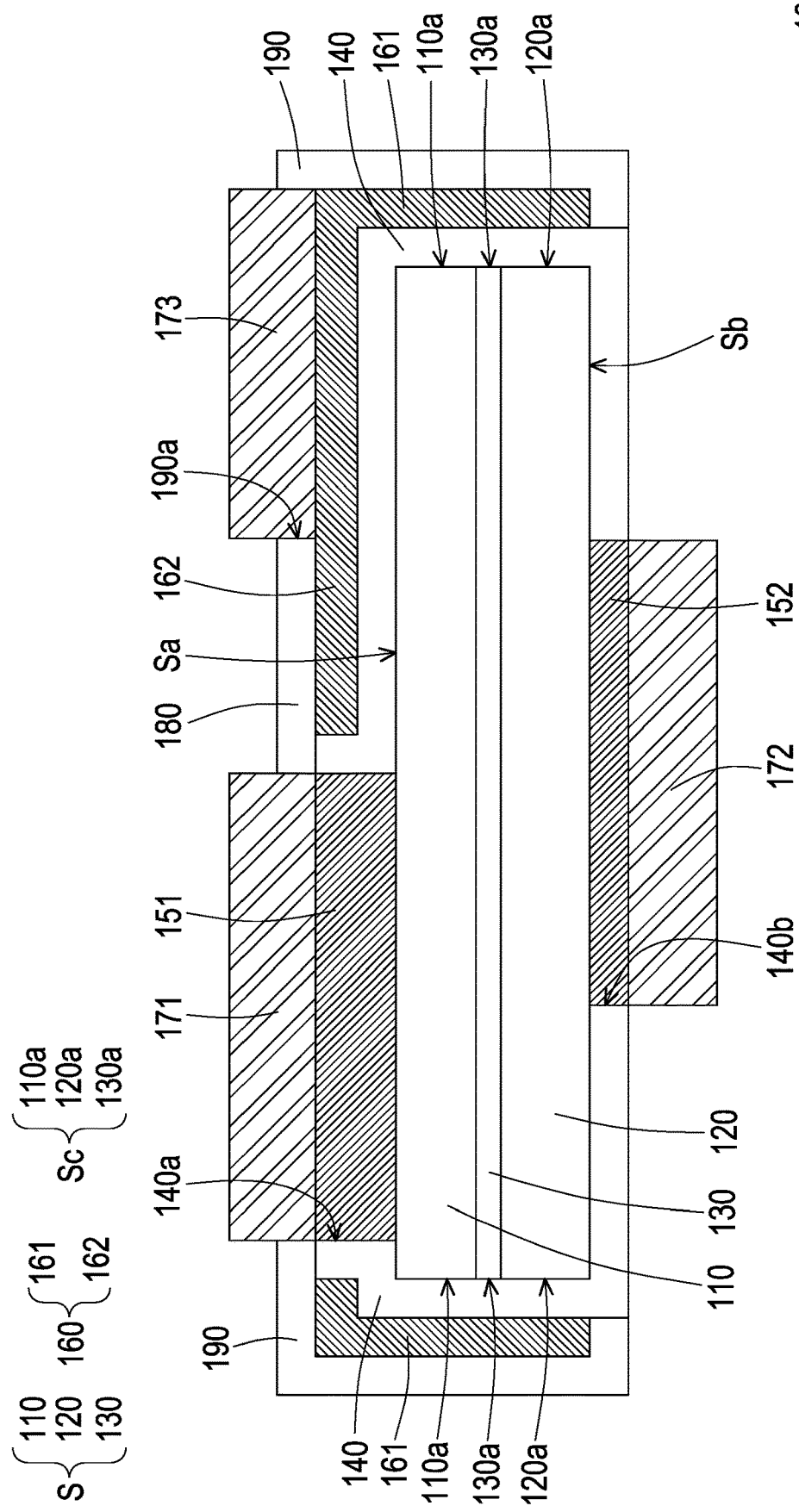
FIG. 14 is a cross-sectional schematic view of a light emitting device 10I according to an embodiment of the disclosure.

FIG. 14 is a cross-sectional schematic view of a light emitting device 10I according to an embodiment of the disclosure. The light emitting device 10I of FIG. 14 is similar to the light emitting device 10H of FIG. 13, the difference between the two is that: in the embodiment of FIG. 13, the third conductive pattern 173 and the second conductive pattern 172 are disposed on the same surface of the semiconductor structure S (i.e., on the first surface Sa); however, in the embodiment of FIG. 14, the third conductive pattern 173 and the first conductive pattern 171 are disposed on the same surface of the semiconductor structure S (i.e., on the first surface Sa).

What is claimed is:

1. A light emitting device, comprising:
   a semiconductor structure, comprising:
   a first type semiconductor layer, the first type semiconductor layer comprising a first sub-side wall and a second sub-side wall, wherein the first and second sub-side walls are located on different planes;
   a second type semiconductor layer; and
   an active layer, disposed between the first type semiconductor layer and the second type semiconductor layer;
   an insulating layer, disposed on the semiconductor structure;
   a first electrode, electrically connected to the first type semiconductor layer, wherein the first electrode is disposed on the first and second sub-side walls of the first type semiconductor layer;
   a second electrode, electrically connected to the second type semiconductor layer; and
   a third electrode, electrically independent from the first electrode and the second electrode, wherein the insulating layer is located between the third electrode and the semiconductor structure, the first electrode, the second electrode, and the third electrode are structurally separated, the third electrode at least has a first portion and a second portion that are electrically connected to each other, and the first portion of the third electrode is disposed on a side wall of the semiconductor structure, while the second portion of the third electrode is disposed between the first electrode and the second electrode.

2. The light emitting device according to claim 1, wherein the side wall of the semiconductor structure comprises a side wall of the active layer, and the first portion of the third electrode is disposed on the side wall of the active layer.

3. The light emitting device according to claim 2, wherein the side wall of the semiconductor structure further comprises a side wall of the first type semiconductor layer, and the first portion of the third electrode is further disposed on the side wall of the first type semiconductor layer.

4. The light emitting device according to claim 3, wherein the side wall of the semiconductor structure further comprises a side wall of the second type semiconductor layer, and the first portion of the third electrode is further disposed on the side wall of the second type semiconductor layer.

5. The light emitting device according to claim 1, further comprising:
   a first conductive pattern, disposed on the first electrode and is electrically connected to the first electrode;
   a second conductive pattern, disposed on the second electrode and is electrically connected to the second electrode; and
   a third conductive pattern, disposed on the third electrode and is electrically connected to the first portion of the third electrode, wherein the first conductive pattern, the second conductive pattern, and the third conductive pattern are structurally separated.

6. The light emitting device according to claim 5, wherein the semiconductor structure has a first surface and a second surface opposite to each other, the side wall of the semiconductor structure is disposed between the first surface and the second surface; wherein the second portion of the third electrode is disposed on the first surface of the semiconductor structure; the third conductive pattern is disposed on the second portion of the third electrode.

7. The light emitting device according to claim 1, further comprising:
   at least one first optical microstructure, overlapping the active layer.

8. The light emitting device according to claim 7, wherein the active layer emits a light beam, and the at least one first optical microstructure converges the light beam.

9. The light emitting device according to claim 7, wherein the active layer has a first region and a second region, the second region of the active layer is located between the first region of the active layer and the side wall of the semiconductor structure, and the light emitting device further comprises:
   at least one second optical microstructure, wherein the at least one first optical microstructure and the at least one second optical microstructure respectively overlap the first region and the second region of the active layer.

10. The light emitting device according to claim 9, wherein the active layer emits a light beam, the at least one first optical microstructure converges the light beam, and the at least one second optical microstructure diverges the light beam.

11. The light emitting device according to claim 1, further comprising:
   at least one second optical microstructure, overlapping the active layer, wherein the active layer emits a light beam, and the at least one second optical microstructure diverges the light beam.

12. The light emitting device according to claim 1, wherein the third electrode has a reverse bias.

* * * * *